(12) United States Patent
Zhang

(10) Patent No.: US 10,038,072 B2
(45) Date of Patent: Jul. 31, 2018

(54) THRESHOLD ADJUSTMENT FOR QUANTUM DOT ARRAY DEVICES WITH METAL SOURCE AND DRAIN

(71) Applicant: STMicroelectronics, Inc., Coppell, TX (US)

(72) Inventor: John H. Zhang, Altamont, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/982,316

(22) Filed: Dec. 29, 2015

(65) Prior Publication Data

US 2016/0111521 A1    Apr. 21, 2016

Related U.S. Application Data

(62) Division of application No. 13/931,234, filed on Jun. 28, 2013.
(Continued)

(51) Int. Cl.
*H01L 21/8238* (2006.01)
*H01L 29/66* (2006.01)
(Continued)

(52) U.S. Cl.
CPC .. *H01L 29/66492* (2013.01); *H01L 21/26513* (2013.01); *H01L 21/823814* (2013.01);
(Continued)

(58) Field of Classification Search
CPC ............................. H01L 29/66; H01L 21/8238
(Continued)

(56) References Cited

U.S. PATENT DOCUMENTS

| 4,485,550 A | 12/1984 | Koeneke et al. |
| 5,346,851 A | 9/1994 | Randall et al. |

(Continued)

OTHER PUBLICATIONS

Zhang et al., "Theoretical Study of the Molecular and Electronic Structures of Neutral Silver Bromide Clusters $(AgBr)_n$, n=1-9," *J. Phys. Chem. A* 104:6287-6294, 2000.
(Continued)

*Primary Examiner* — Asok K Sarkar
*Assistant Examiner* — Dmitriy Yemelyanov
(74) *Attorney, Agent, or Firm* — Seed IP Law Group LLP

(57) ABSTRACT

Incorporation of metallic quantum dots (e.g., silver bromide (AgBr) films) into the source and drain regions of a MOSFET can assist in controlling the transistor performance by tuning the threshold voltage. If the silver bromide film is rich in bromine atoms, anion quantum dots are deposited, and the AgBr energy gap is altered so as to increase $V_t$. If the silver bromide film is rich in silver atoms, cation quantum dots are deposited, and the AgBr energy gap is altered so as to decrease $V_t$. Atomic layer deposition (ALD) of neutral quantum dots of different sizes also varies $V_t$. Use of a mass spectrometer during film deposition can assist in varying the composition of the quantum dot film. The metallic quantum dots can be incorporated into ion-doped source and drain regions. Alternatively, the metallic quantum dots can be incorporated into epitaxially doped source and drain regions.

20 Claims, 11 Drawing Sheets

Related U.S. Application Data

(60) Provisional application No. 61/705,612, filed on Sep. 25, 2012.

(51) Int. Cl.
  H01L 29/775 (2006.01)
  H01L 21/66 (2006.01)
  H01L 29/45 (2006.01)
  H01L 29/778 (2006.01)
  H01L 29/41 (2006.01)
  H01L 21/265 (2006.01)
  H01L 29/417 (2006.01)
  H01L 29/423 (2006.01)
  H01L 29/49 (2006.01)
  H01L 29/10 (2006.01)
  H01L 29/165 (2006.01)

(52) U.S. Cl.
  CPC ............ H01L 22/12 (2013.01); H01L 29/413 (2013.01); H01L 29/456 (2013.01); H01L 29/66431 (2013.01); H01L 29/66666 (2013.01); H01L 29/775 (2013.01); H01L 29/7781 (2013.01); H01L 21/823842 (2013.01); H01L 29/1054 (2013.01); H01L 29/165 (2013.01); H01L 29/41766 (2013.01); H01L 29/4236 (2013.01); H01L 29/4975 (2013.01); H01L 2924/0002 (2013.01)

(58) Field of Classification Search
  USPC .................................................. 438/212, 272
  See application file for complete search history.

(56) References Cited

U.S. PATENT DOCUMENTS

| | | | |
|---|---|---|---|
| 5,923,046 | A | 7/1999 | Tezuka et al. |
| 5,960,319 | A | 9/1999 | Iwata et al. |
| 6,005,271 | A | 12/1999 | Hshieh |
| 6,042,345 | A | 3/2000 | Bishop et al. |
| 6,207,482 | B1 | 3/2001 | Shih et al. |
| 6,268,273 | B1 | 7/2001 | Kim et al. |
| 6,482,714 | B1 | 11/2002 | Hieda et al. |
| 6,518,625 | B1 | 2/2003 | Nishida et al. |
| 6,559,468 | B1 | 5/2003 | Kuekes et al. |
| 6,737,323 | B2 | 5/2004 | Mo |
| 6,780,742 | B1* | 8/2004 | Wasshuber ............ B82Y 10/00 257/E21.165 |
| 7,019,333 | B1 | 3/2006 | Shields et al. |
| 7,172,980 | B2 | 2/2007 | Torres et al. |
| 7,180,087 | B1 | 2/2007 | Loss et al. |
| 7,582,490 | B2 | 9/2009 | Golovchenko et al. |
| 8,294,137 | B2 | 10/2012 | Jain et al. |
| 8,598,006 | B2 | 12/2013 | de Souza et al. |
| 8,680,577 | B2 | 3/2014 | Zhang et al. |
| 8,859,350 | B2 | 10/2014 | Zhang et al. |
| 8,981,344 | B2 | 3/2015 | Jain et al. |
| 2001/0032999 | A1* | 10/2001 | Yoshida ............ H01L 29/66674 257/332 |
| 2002/0043895 | A1 | 4/2002 | Richards et al. |
| 2002/0123183 | A1 | 9/2002 | Fitzgerald |
| 2002/0134996 | A1 | 9/2002 | Morie et al. |
| 2002/0196827 | A1 | 12/2002 | Shields et al. |
| 2003/0122179 | A1 | 7/2003 | Matsuki et al. |
| 2003/0127608 | A1 | 7/2003 | Shields et al. |
| 2004/0155253 | A1 | 8/2004 | Chae et al. |
| 2005/0074340 | A1 | 4/2005 | Xu et al. |
| 2005/0153530 | A1 | 7/2005 | Ku et al. |
| 2005/0263795 | A1 | 12/2005 | Choi et al. |
| 2006/0011990 | A1 | 1/2006 | Furukawa et al. |
| 2006/0081930 | A1 | 4/2006 | Maegawa et al. |
| 2006/0163670 | A1 | 7/2006 | Ellis-Monaghan et al. |
| 2007/0007571 | A1 | 1/2007 | Lindsay et al. |
| 2007/0166972 | A1 | 7/2007 | Park |
| 2007/0176227 | A1 | 8/2007 | Liu et al. |
| 2007/0187776 | A1 | 8/2007 | Sasaki |
| 2007/0189702 | A1 | 8/2007 | Arndt et al. |
| 2007/0210299 | A1 | 9/2007 | Hirose et al. |
| 2007/0215860 | A1 | 9/2007 | Komiyama et al. |
| 2007/0252131 | A1 | 11/2007 | Tong et al. |
| 2007/0298558 | A1 | 12/2007 | Yamauchi et al. |
| 2008/0035962 | A1 | 2/2008 | Kim et al. |
| 2008/0054351 | A1 | 3/2008 | Ooki |
| 2008/0076216 | A1 | 3/2008 | Pae et al. |
| 2008/0079074 | A1 | 4/2008 | Icel et al. |
| 2008/0122005 | A1 | 5/2008 | Horsky et al. |
| 2008/0124920 | A1 | 5/2008 | Fitz et al. |
| 2008/0142838 | A1 | 6/2008 | Ohta et al. |
| 2008/0169753 | A1 | 7/2008 | Skipor et al. |
| 2008/0309234 | A1 | 12/2008 | Cho et al. |
| 2009/0054752 | A1 | 2/2009 | Jonnalagadda et al. |
| 2009/0173934 | A1 | 7/2009 | Jain |
| 2009/0194788 | A1 | 8/2009 | Liu et al. |
| 2009/0309229 | A1 | 12/2009 | Angus et al. |
| 2010/0074293 | A1 | 3/2010 | Lochmann et al. |
| 2010/0108984 | A1 | 5/2010 | Cho et al. |
| 2010/0155703 | A1 | 6/2010 | Jun et al. |
| 2010/0163843 | A1 | 7/2010 | Choi et al. |
| 2010/0213553 | A1 | 8/2010 | Hargrove et al. |
| 2010/0224861 | A1 | 9/2010 | Jain et al. |
| 2010/0224938 | A1 | 9/2010 | Zhu |
| 2010/0308374 | A1 | 12/2010 | Liu et al. |
| 2011/0079767 | A1 | 4/2011 | Senes et al. |
| 2011/0163327 | A1 | 7/2011 | Ueno et al. |
| 2011/0176564 | A1 | 7/2011 | Hogg et al. |
| 2011/0193145 | A1 | 8/2011 | Ikarashi et al. |
| 2011/0309330 | A1 | 12/2011 | Ohnesorge |
| 2012/0080793 | A1 | 4/2012 | Danek et al. |
| 2012/0091448 | A1 | 4/2012 | Ueno et al. |
| 2012/0132966 | A1 | 5/2012 | Doris et al. |
| 2012/0181503 | A1 | 7/2012 | Lee et al. |
| 2012/0229167 | A1 | 9/2012 | Jain et al. |
| 2012/0280208 | A1 | 11/2012 | Jain |
| 2012/0285532 | A1 | 11/2012 | Yun et al. |
| 2012/0313144 | A1 | 12/2012 | Zhang et al. |
| 2013/0093289 | A1 | 4/2013 | Zhang |
| 2013/0302974 | A1 | 11/2013 | Hahn et al. |
| 2014/0015038 | A1 | 1/2014 | Ng et al. |
| 2014/0084245 | A1 | 3/2014 | Zhang |
| 2014/0084247 | A1 | 3/2014 | Zhang |
| 2015/0053930 | A1 | 2/2015 | Zhang |
| 2016/0111521 | A1 | 4/2016 | Zhang |

OTHER PUBLICATIONS

Zhang et al., "Quantum size effect studies of isotopic and electronic properties of silver bromide ionic clusters," 2012, 26 pages.

Correa et al., "Preparation of AgBr Quantum Dots via Electroporation of Vesicles," J. Am. Chem. Soc. 122:6432-6434, 2000.

Foster et al., "Natural Hybrid Orbitals," J. Am. Chem. Soc. 102:7211-7218, 1980.

Mulliken, "Electronic Population Analysis on LCAO-MO Molecular Wave Functions," The Journal of Chemical Physics 23(10):1833-1840, 1955.

Reed et al., "Intermolecular Interactions from a Natural Bond Orbital, Donor-Acceptor Viewpoint," Chem. Rev. 88:899-926, 1988.

Wallmeier et al., "Nature of the Semipolar XO Bond. Comparative Ab Initio Study of $H_3NO$, $H_2NOH$, $H_3PO$, $H_2POH$, $H_2P(O)F$, $H_2SO$, HSOH, HClO, ArO, and Related Molecules," Journal of the American Chemical Society 101(11):2804-2814, 1979.

Zhang et al., "A Study of Relationship Between Universality in Fractal Colloids Aggregation and Time-dependent SERS," Science in China 37(4):395-401, 1994.

Zhang et al., "Time dependent UC-absorption spectra and surface enhanced Raman scattering of pyridine in AgCl sol," Spectrochimica Acta Part A 51:1903-1908, 1995.

Zhang et al., "Time dependent surface enhances Raman spectroscopy of pyridine in AgBr sol," Spectrochimica Acta 47A(7):927-932, 1991.

(56) References Cited

OTHER PUBLICATIONS

Alivisatos, "Semiconductor Clusters, Nanocrystals, and Quantum Dots," *Science*, New Series, vol. 271, No. 5251 (Feb. 16, 1996), pp. 933-937.

"Theoretical and Experimental Studies of Silver Bromide Clusters," Doctoral dissertation by Hongguang Zhang, University of Texas at Arlington, 2000, 130 pages.

* cited by examiner

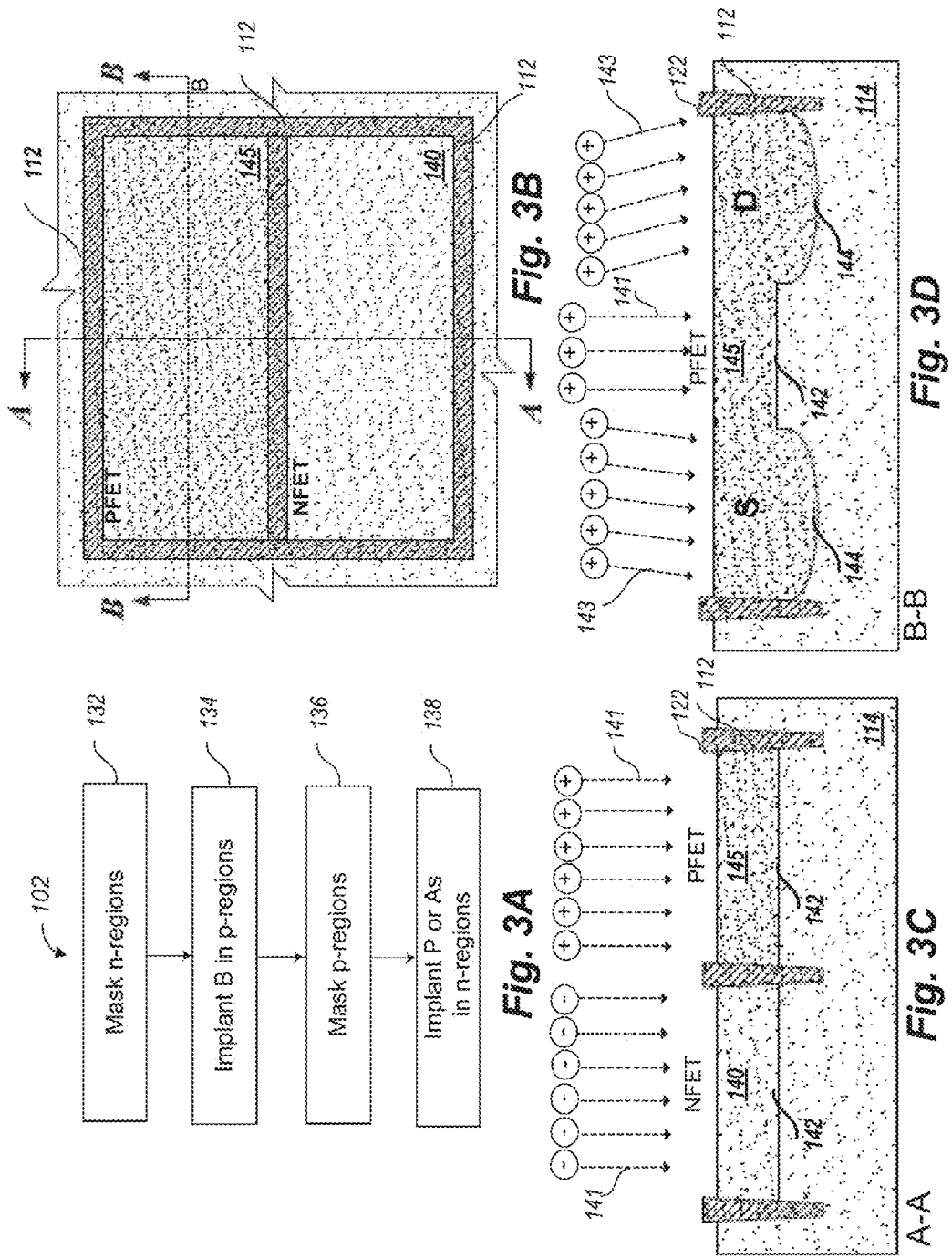

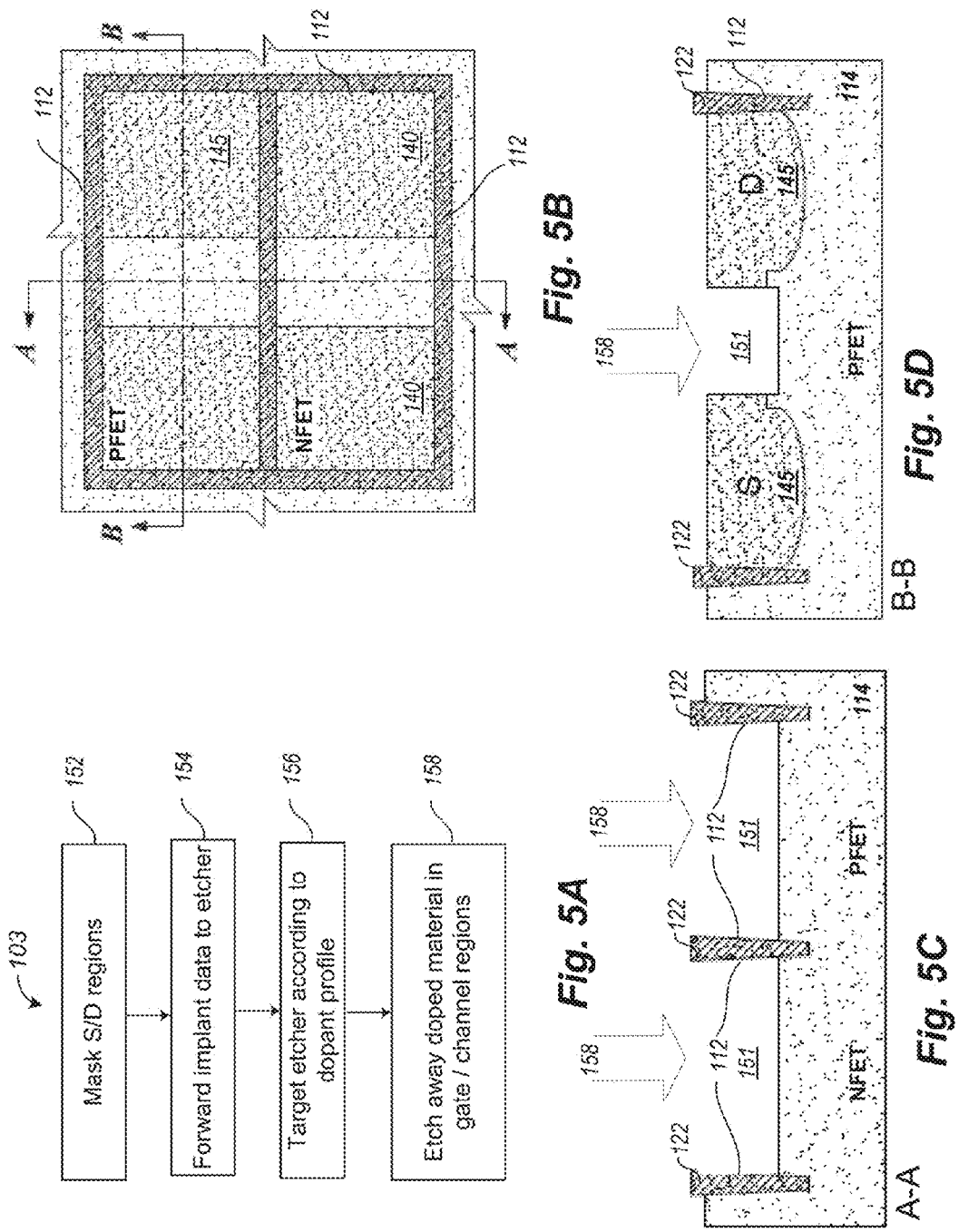

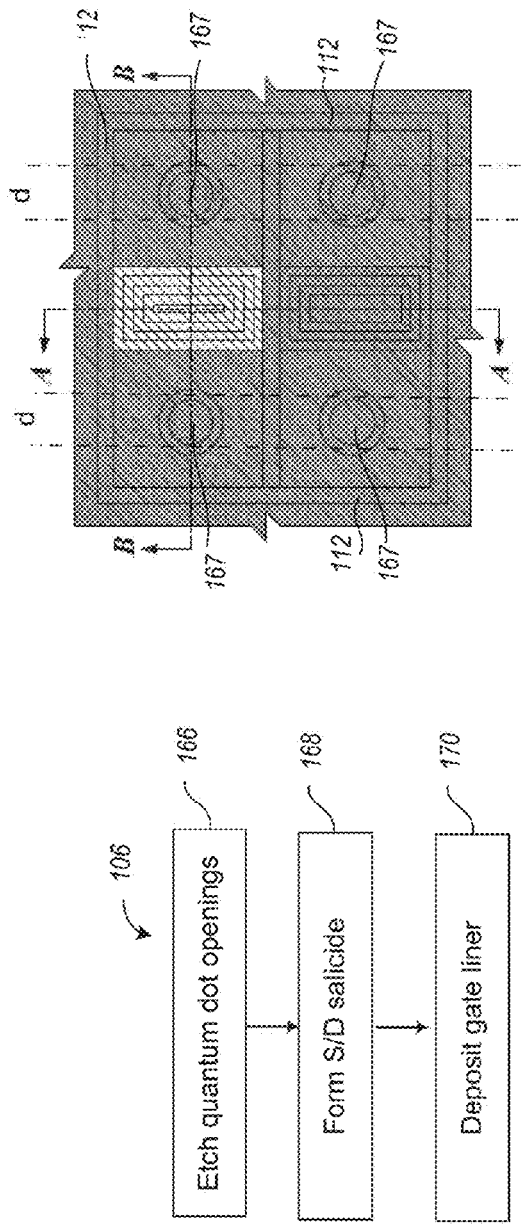
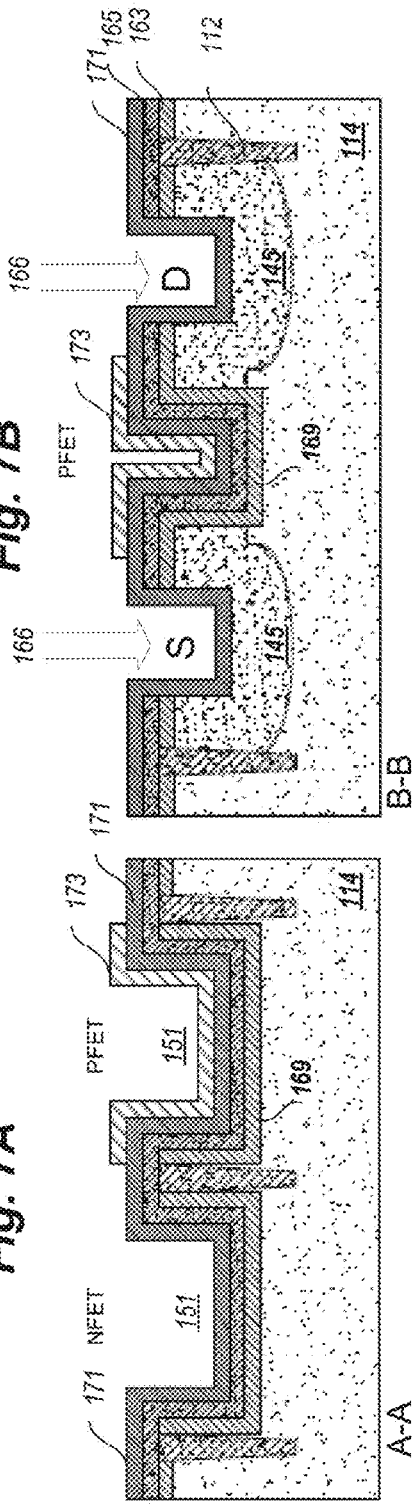
Fig. 7A
Fig. 7B
Fig. 7C
Fig. 7D

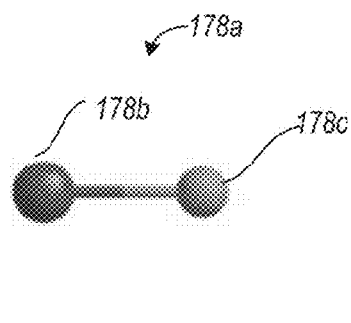
*Fig. 9A*
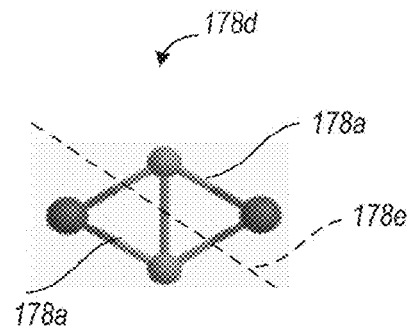
*Fig. 9B*
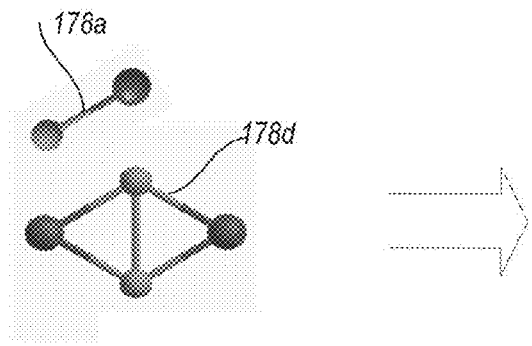
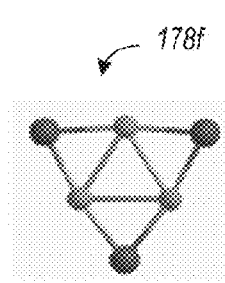
*Fig. 9C*
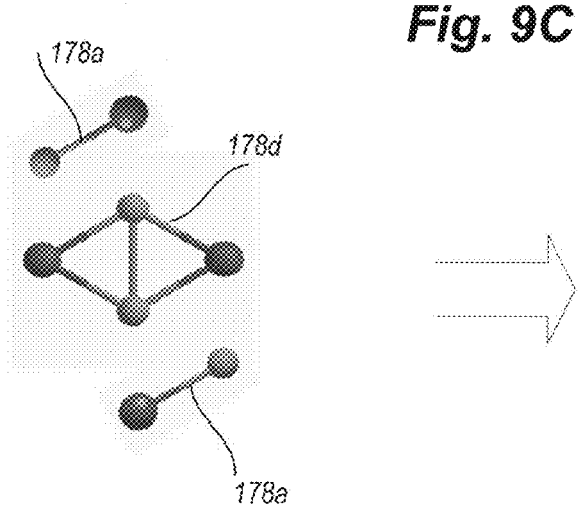
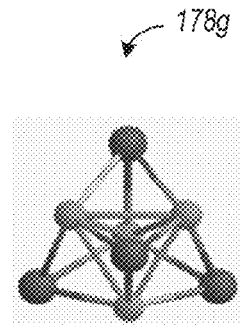
*Fig. 9D*
*(Prior Art)*

THRESHOLD ADJUSTMENT FOR QUANTUM DOT ARRAY DEVICES WITH METAL SOURCE AND DRAIN

RELATED APPLICATION

This patent application is a divisional of U.S. patent application Ser. No. 13/931,234 which claimed benefit under 35 U.S.C. § 119(e) of U.S. Provisional Patent Application No. 61/705,612, filed on Sep. 25, 2012, which are hereby incorporated by reference in their entirety.

BACKGROUND

Technical Field

The present disclosure relates to the fabrication of nanometer-sized integrated circuit field effect transistor (FET) devices and, in particular, to devices that incorporate quantum dot films to control electrical characteristics of the devices.

Description of the Related Art

As technology nodes for integrated circuits scale below 10 nm, maintaining precise control of various electrical characteristics in bulk semiconductor devices becomes increasingly more challenging. Bulk semiconductor devices include, for example, metal-oxide-semiconductor field effect transistors (MOSFETs). A MOSFET is a three-terminal switching device that includes a source, a gate, and a drain. MOSFETs are interconnected by a network of wires through contacts to each of the source, drain, and gate terminals.

When a voltage exceeding a certain threshold voltage ($V_t$) is applied to the MOSFET gate, the device switches on so that an electric current flows through a channel between the source and the drain. Thus, improving device performance depends on the ability to control $V_t$. The value of $V_t$ depends, in part, on the characteristic energy band structure of the semiconductor material and, in particular, on a characteristic band gap which represents the amount of energy needed to boost a valence electron into the conduction band, where the electron can participate as a charge carrier in the channel current. Altering the semiconductor crystal is thus a way to control the band gap and in turn, the threshold voltage.

In conventional devices, the semiconductor crystal was typically altered, for example, by doping the crystal with ions in the source and drain regions of a MOSFET. In a silicon device, for example, the doping process alters the crystal structure by substituting ions for the silicon atoms. Improvements in device performance (e.g., switching speed) traditionally has been largely dependent upon control of doping concentrations in the source and drain and the locations (e.g., depth profiles) of the dopants in the substrate after ion implantation and/or after annealing implanted regions at high temperatures. In recent years, alternative methods of introducing dopants without damaging the substrate have included in-situ doping during a process of epitaxial crystal growth at the surface of the substrate.

BRIEF SUMMARY

Quantum dots are materials (e.g., semiconductors, metals) whose electronic characteristics are closely related to their crystal structure. Quantum dot structures have intermediate electronic properties that differ from both bulk materials and discrete molecules, and these electronic properties can be tuned by varying the size and spacing of the quantum dot crystals. Thus, quantum dots allow more precise control over conductive properties of the crystalline materials by altering the fundamental crystalline structure. Embodiments discussed herein incorporate metallic quantum dots into the source and drain regions of a MOSFET to assist in controlling the transistor performance. In a first embodiment, metal quantum dots are incorporated into ion-doped source and drain regions; in a second embodiment, metal quantum dots are incorporated into in-situ-doped epitaxial source and drain regions.

In particular, according to one embodiment, one quantum dot of a different material from the source/drain material is placed into each of the source and the drain of a transistor. In one preferred embodiment, the source is composed of epitaxially grown semiconductor material, such as silicon or germanium, doped to a selected concentration level. A quantum dot composed of a different type of material, for example a metal, and therefore having a different crystalline structure, is embedded in the semiconductor source and/or drain region. In one embodiment, a single metal quantum dot is incorporated into each respective source and drain of a transistor. The size, shape, location, and area taken up by the added metal quantum dot will alter the operational characteristics of the transistor and provide improved performance of certain parameters. The respective properties of the metal quantum dot, as well as its location and interface with the source region, can be selected to achieve the desired modification of the transistor characteristics.

A semiconductor device is disclosed in which one or more active regions of the semiconductor incorporates metal quantum dots having a molecular composition that includes clusters of monomers that determine the threshold voltage of the device. Incorporation of metallic quantum dots (e.g., silver bromide (AgBr) films) into the source and drain regions of a MOSFET can assist in controlling the transistor performance by tuning the threshold voltage. If the silver bromide film is rich in bromine atoms, anion quantum dots are deposited, and the AgBr energy gap is altered so as to increase $V_t$. If the silver bromide film is rich in silver atoms, cation quantum dots are deposited, and the AgBr energy gap is altered so as to decrease $V_t$. ALD deposition of neutral quantum dots of different sizes also varies $V_t$. The metallic quantum dots can be incorporated into ion-doped source and drain regions. Alternatively, the metallic quantum dots can be incorporated into in-situ-doped epitaxial source and drain regions.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 3A is a process flow diagram showing a detailed sequence of processing steps that can be used to form n-doped and p-doped carrier reservoirs in the source and drain regions of the NFET and PFET devices via ion implantation.

FIG. 3B is a top plan view of PFET and NFET devices after carrying out the processing steps shown in FIG. 3A.

FIG. 3C is a cross-sectional view of the NFET and PFET gates shown in FIG. 3B, taken along the cut lines A-A.

FIG. 3D is a cross-sectional view of the PFET device shown in FIG. 3B, taken along cut lines B-B.

FIG. 5A is a process flow diagram showing a detailed sequence of processing steps that can be used to remove doped silicon from the substrate to form recessed gate regions of the NFET and PFET devices, according to one embodiment.

FIG. 5B is a top plan view of a layout for an array of quantum dot PFET and NFET devices after carrying out the processing steps shown in FIG. 5A.

FIG. 5C is a cross-sectional view of the NFET and PFET gates shown in FIG. 5B, taken along the cut lines A-A.

FIG. 5D is a cross-sectional view of the PFET device shown in FIG. 5B, taken along cut lines B-B.

FIG. 7A is a process flow diagram showing a detailed sequence of processing steps that can be used to form metal silicides that reduce contact resistance, according to one embodiment.

FIG. 7B is a top plan view of a layout for an array of quantum dot PFET and NFET devices after carrying out the processing steps shown in FIG. 7A.

FIG. 7C is a cross-sectional view of the NFET and PFET gates shown in FIG. 7B, taken along the cut lines A-A.

FIG. 7D is a cross-sectional view of the PFET device shown in FIG. 7B, taken along cut lines B-B.

FIGS. 9A-9D are molecular diagrams illustrating formation of silver bromide clusters according to the prior art.

DETAILED DESCRIPTION

Figure 1:
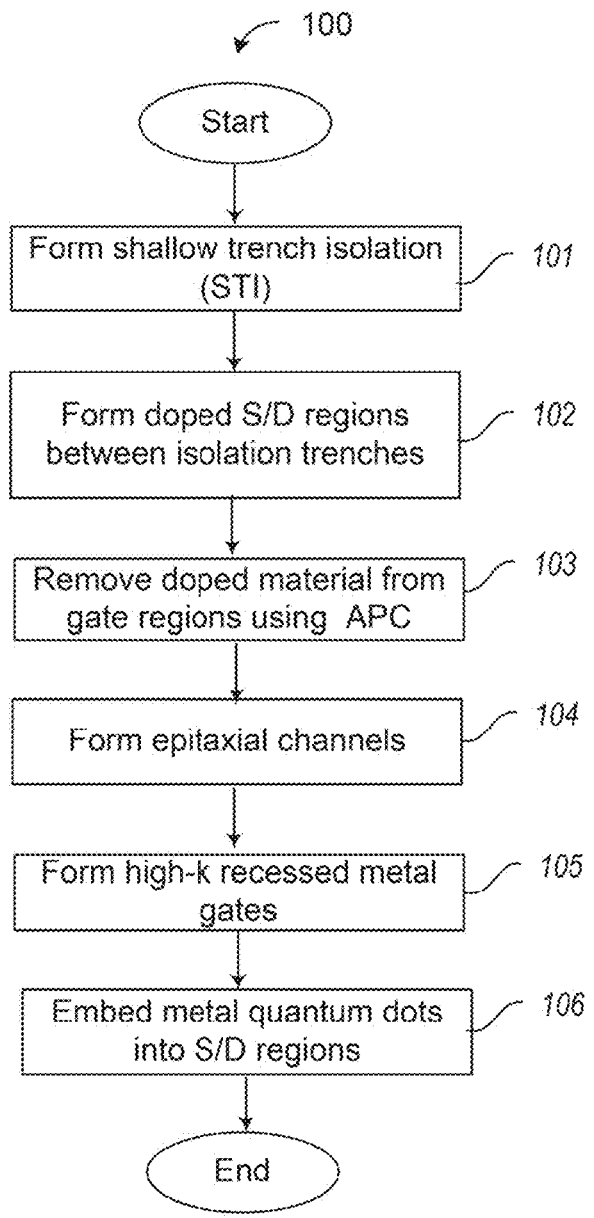
FIG. 1 is a high-level flow diagram summarizing a processing sequence for fabricating MOSFET devices that incorporate metal quantum dot sources and drains, according to two alternative embodiments.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the terms "layer" is used in its broadest sense to include a thin film, a cap, or the like. The term "layout" refers to a drawn pattern seen from a top plan view that implements an integrated circuit design. The layout specifies geometries and spacings of materials formed at each layer of the integrated circuit. Geometries and spacings for each layout are calculated according to a desired operational circuit specification.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber. The term "epitaxy" refers to a controlled process of crystal growth in which a new layer of a crystal is grown from the surface of a bulk crystal, while maintaining the same crystal structure as the underlying bulk crystal. The new layer is then referred to as an "epitaxially-grown" or "epitaxial" layer. Impurities can be incorporated into an epitaxial film, in-situ, as the crystal structure is formed, without imparting damage to the crystal structure.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of quantum dots, transistor devices, and transistor layouts that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

FIG. 1 shows a high-level sequence of processing steps in a method 100 that can be used to create metal quantum dot array devices, according to a first embodiment. The devices described herein incorporate metal quantum dots into the source and drain regions of MOSFET transistors.

At 101, shallow trench isolation (STI) regions are formed to electrically isolate individual transistors as is known in the art. The silicon substrate is then recessed below the STI regions.

At 102, charge reservoirs in the source and drain regions are formed by doping areas of a silicon substrate between pairs of isolation trenches. A first method of doping uses conventional ion implantation. A second method of doping uses in-situ epitaxial growth.

At 103, doped silicon is selectively removed from the gate regions while remaining in the source and drain regions.

At 104, epitaxial channels are formed between the source and drain regions.

At 105, a high-k gate is formed that includes a gate dielectric made of a material that has a high dielectric constant (e.g., halfnium oxide ($HfO_2$) or $Al_2O_3$) and a metal gate electrode.

At 106, metal quantum dots are embedded into the source and drain regions to adjust the energy band structure of the source and drain junctions, to improve device performance.

FIGS. 2A-7D show and describe in further detail steps in the method 100. In each set of Figures A-D, A is a detailed flow diagram; B is a top plan view showing the transistor layout at the current layer; C is a cross sectional schematic view at a cut line A-A through the gate regions of both a negative channel (NFET) device and a positive channel (PFET) device; and D is a cross-sectional view at a cut line B-B through the source, drain, and gate of a PFET transistor, in particular. In accordance with convention, arrows on each cut line represent the direction of an observer's eye looking at the corresponding cut plane. The cross-sectional views C, D correspond to the area within the dotted lines of the plan view B.

Figure 2A:
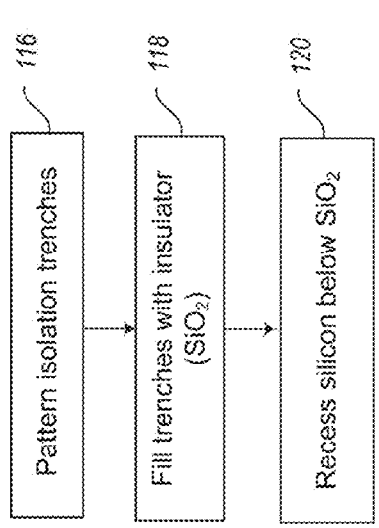
FIG. 2A is a process flow diagram showing a detailed sequence of processing steps that can be used to form isolation regions in a silicon substrate, according to one embodiment described herein.

FIG. 2A shows the initial process step 101 in more detail, as a sequence of steps that can be used to form and fill isolation trenches 112 in a silicon substrate 114, according to one embodiment.

At 116, the isolation trenches 112 are patterned in the silicon substrate 114 using conventional lithography and reactive ion etching (RIE) techniques known to those skilled in the art of semiconductor fabrication.

At 118, the isolation trenches 112 are filled with an insulating material, typically a type of silicon dioxide ($SiO_2$), forming isolation regions, sometimes called shallow trench isolation 122 (STI), though the aspect ratio (depth:width) of the trenches may not be consistent with the term "shallow." For example, in one embodiment as described herein, the depth of the STI is within the range of about 10-200 nm. The STI fill operation can be carried out according to known plasma deposition techniques. The outer STI regions 122 electrically insulate the NFET and PFET devices from neighboring devices (FIGS. 2C, 2D) and the central STI region 123 insulates the NFET and PFET devices from one another (FIG. 2C).

At 120, a silicon surface 124 of the silicon substrate 114 is recessed slightly below the upper surface of the STI 122.

Figure 2B:
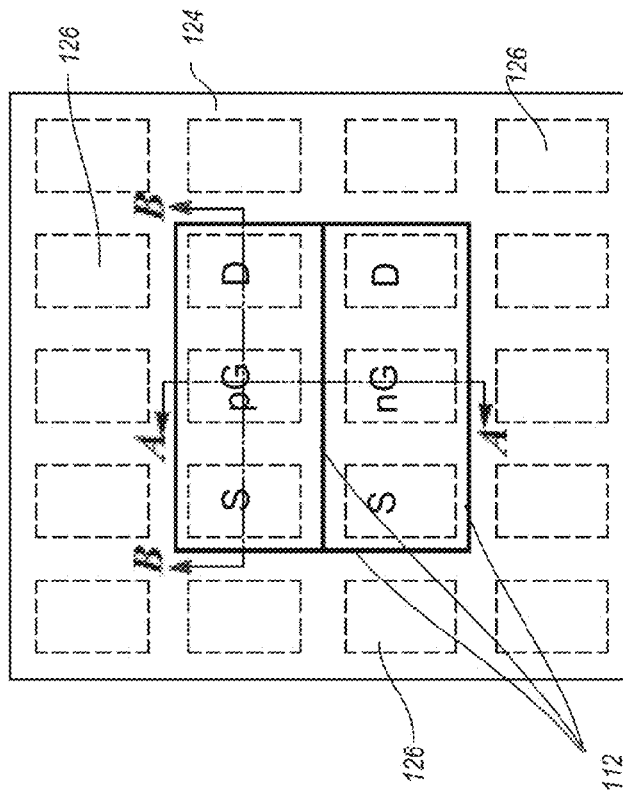
FIG. 2B is a top plan view of a layout for an array of quantum dot PFET and NFET devices after carrying out the processing steps shown in FIG. 2A.
Figure 2D:
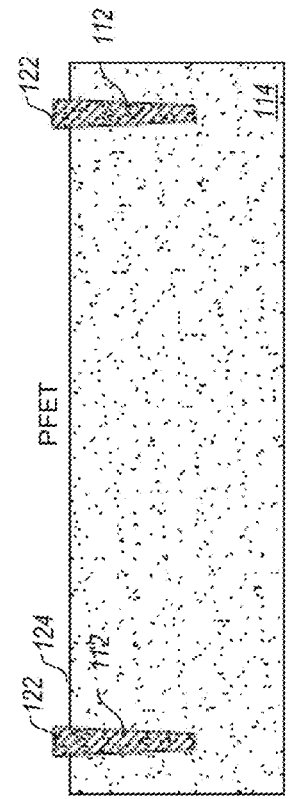
FIG. 2D is a cross-sectional view of the PFET device shown in FIG. 2B, taken along cut lines B-B.
Figure 2C:
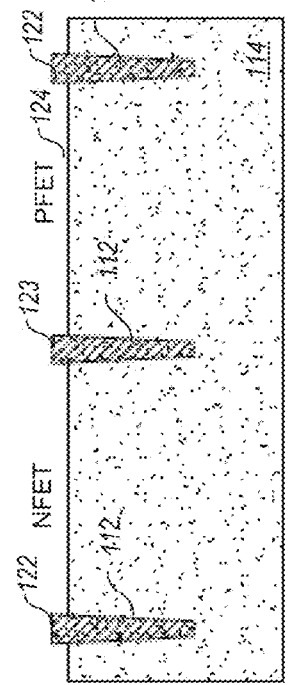
FIG. 2C is a cross-sectional view of the NFET and PFET gates shown in FIG. 2B, taken along the cut lines A-A.

FIG. 2B shows a top plan view that corresponds to the two cross sections, FIGS. 2C, 2D, as described above. The thick solid lines shown in FIG. 2B are approximately aligned with the isolation trenches 112 that delineate the boundaries of the NFET and PFET devices, both physically and electrically. The future locations of each transistor are foreshadowed by three rectangular fields shown as dotted rectangles in FIG. 2B. For example, the NFET will be the lower transistor (S-nG-D), in which the gate of the future NFET device is marked "nG". Likewise, the PFET device will be the upper transistor (S-pG-D, along the cut lines B-B), in which the gate of the future PFET device is marked "pG". Other rectangular fields 126, shown in FIG. 2B also shown as dotted lines, are associated with neighboring transistors.

FIG. 3A shows the process step 102 in further detail, as a sequence of steps that can be used to dope source and drain regions of the NFET and PFET devices by ion implantation, as indicated in FIGS. 3B, 3C, and 3D according to a first embodiment.

At 132, regions of the substrate 114 that are to be implanted with negative ions (e.g., 140) are masked, preferably using a silicon nitride hard mask.

At 134, a first ion implantation is carried out to introduce positive dopants (e.g., boron) into the substrate 114. Implantation in a downward direction 141, substantially normal to the surface of the substrate 114, is desirable to achieve a horizontal p-doping profile 142. Implantation in a slightly diagonal direction 143, at a small angle to a surface normal, is desirable to optimize curved p-doping profiles 144. The desired concentration of positive dopants in p-doped carrier reservoirs 145 is within the range of about 1.0 E19-1.0 E21 atoms/cm$^3$, with a target concentration of about 2.0 E20 atoms/cm$^3$.

At 136, the hard mask is removed from the n-doped regions 140, and p-doped carrier reservoirs 145 are masked.

At 138, a second ion implantation is carried out to introduce negative dopants (e.g., phosphorous, arsenic) into the substrate 114. Implantation in the downward direction 141 substantially normal to the surface of the substrate 114 is desirable to achieve a horizontal n-doping profile 141. The desired concentration of negative dopants in the n-doped regions 140 is within the range of about 1.0 E19-1.0 E21 atoms/cm$^3$, with a target of about 2.0 E20 atoms/cm$^3$.

The ion implantation process shown and described in FIGS. 3A-3D is sometimes preferred for minimum dimensions (i.e., gate lengths) below 20 nm. At such small geometries, damage caused by ion implantation may result in severe degradation of the silicon crystalline structure in the source and drain regions. Sometimes the degradation is so great that it cannot be healed sufficiently by a later annealing process. In such cases, an alternative doping method can be substituted for ion implantation. One such alternative, source and drain doping during in-situ epitaxial growth, is presented as a second embodiment of the process step 102, shown and described in detail in FIGS. 4A-4D.

Figure 4B:
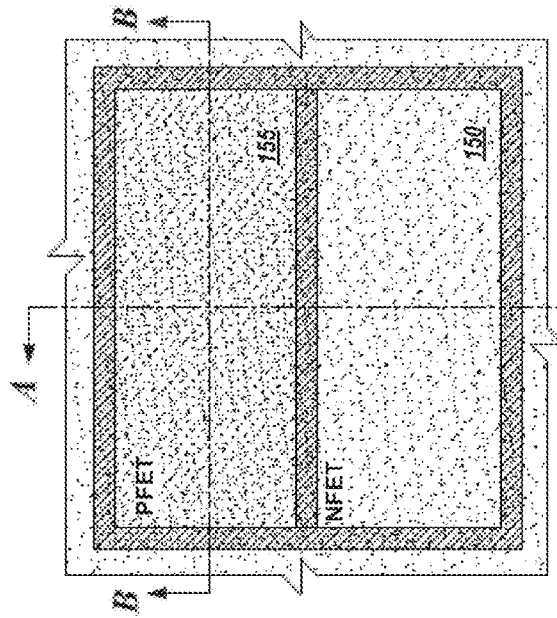
FIG. 4B is a top plan view of a layout for an array of quantum dot PFET and NFET devices after carrying out the processing steps shown in FIG. 4A.
Figure 4D:
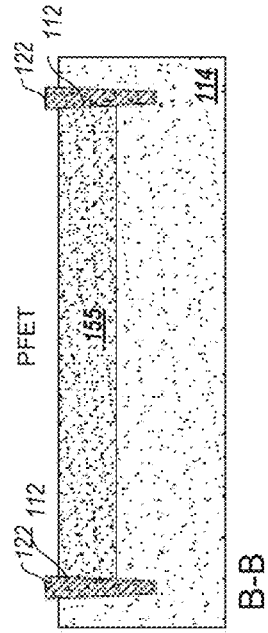
FIG. 4D is a cross-sectional view of the PFET device shown in FIG. 4B, taken along cut lines B-B.
Figure 4A:
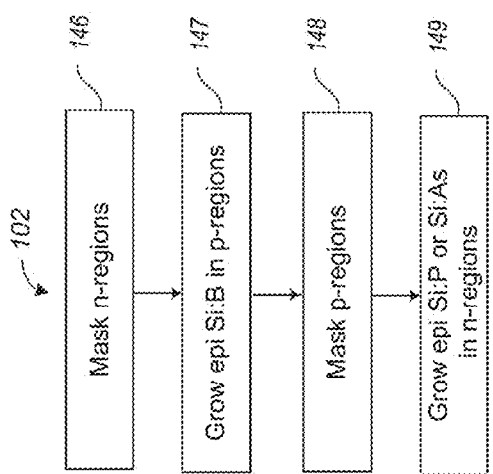
FIG. 4A is a process flow diagram showing a detailed sequence of processing steps that can be used to form n-doped and p-doped carrier reservoirs in the source and drain regions of the NFET and PFET devices via in-situ epitaxial growth.

FIG. 4A shows a sequence of process steps that can be used to form an epitaxial n-doped carrier reservoir 150 and epitaxial p-doped carrier reservoirs 155.

At 146, regions of the substrate 114 that are to be epitaxially doped in situ with negative ions (carrier reservoirs 150) are masked, preferably using a silicon nitride hard mask. There are least two different techniques by which the epitaxially formed source and drain regions can be grown. According to a first technique, a mask is aligned with the region that will become the p-region of the substrate. The substrate is then etched away to remove the substrate material between the shallow trench isolation regions at the edges of the mask opening. This will leave the isolation trenches 112 in the substrate and adjacent to the regions which are covered by the mask. After this, the epitaxial material is grown to fill the recess which has been etched away, to form a new region which is doped in-situ during the process of epitaxial growth. The epitaxial layer completely fills the region between the isolation trenches 112. This ensures that the epitaxial region will be self-aligned with the shallow trench isolation regions, since they form the boundary by which the epitaxial growth takes place.

At 147, a first epitaxial growth process is carried out that incorporates positive dopants (e.g., epitaxial silicon-boron (epi Si:B)) into the substrate 114. The epitaxial doping process results in the p-doped carrier reservoir 155 (FIGS. 4C, 4D) that is recognizable by its uniform horizontal doping profile. The p-doped carrier reservoir 155 is therefore noticeably distinct from the curved p-doping profiles 144 that result from the small angle ion implantation process described shown above in FIG. 3D. The concentration of positive dopants in the epitaxial p-doped carrier reservoirs 155 is about 2.0 E21 atoms/cm$^3$ for epi Si:B.

At 148, the hard mask is removed from the n-doped carrier reservoirs 150, and the epitaxial p-doped carrier reservoirs 155 are masked.

Figure 4C:
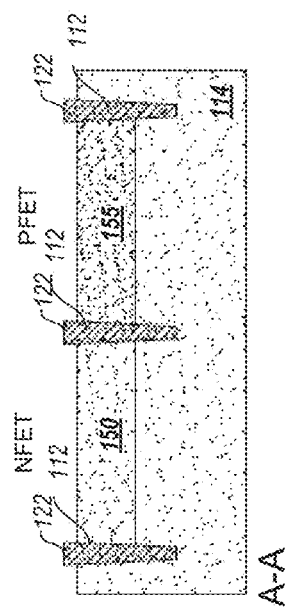
FIG. 4C is a cross-sectional view of the NFET and PFET gates shown in FIG. 4B, taken along the cut lines A-A.

At 149, a second epitaxial growth process is carried out to incorporate negative dopants (e.g., epitaxial silicon-phosphorous (epi Si:P), or epitaxial silicon-arsenic (epi Si:As)) into the substrate 114. The epitaxial doping process results in the n-doped carrier reservoir 150 (FIG. 4C). The concentration of negative dopants in the n-doped carrier reservoir 150 is about 1.0 E21 atoms/cm$^3$ for epi Si:As, and about 5.0 E20 atoms/cm$^3$ for epi Si:P.

According to a second technique, epitaxial growth of the carrier reservoirs 150 and 155 can occur prior to formation of the isolation trenches 112. A portion of the substrate 114 is masked to prevent growth of the epitaxial layer, while epitaxial growth takes place in those areas which are unmasked. This type of epitaxial growth is a purely additive technique in which the epitaxially grown crystalline structure is added to the current substrate, after which isolation trenches 112 are etched through the epitaxial layer and filled.

Either of the two techniques may be used to create the separate epitaxially doped charge reservoirs as shown in FIGS. 4C and 4D, although the second technique is generally preferred. Other techniques may also be used to form the epitaxially grown source and drain regions.

FIG. 5A shows the process step 103 in further detail, as a sequence of steps that can be used to create recessed gate areas 151 shown in FIGS. 5B, 5C, and 5D, according to one embodiment. The recessed gate areas 151 will accommodate the epitaxial channels and recessed metal gates formed in subsequent processing steps. The recessed gate areas 151 can be formed by etching away portions of the n-doped and p-doped carrier reservoirs 140 and 145, respectively, using an RIE process that is carried out in a plasma etcher.

At 152, the source and drain areas are masked so as to recess only the areas where the epitaxial channels and the transistor gates will be formed.

At 154, dopant profile data collected during the ion implantation processing steps 134 and 138 is forwarded to a controller that controls the plasma etcher, in a scheme referred to as advanced process control (APC).

At 156, using APC, a customized target depth is set for the etching process on a lot-by-lot basis, wherein the target depth is based on the ion implantation data. In this way, etch profiles of the recessed gate areas 151 can be adjusted to match the dopant profiles 143 and 147. To prevent short channel effects, it is desirable that the recessed gate areas 151 extend laterally in both directions to fully intersect the isolation trenches 112. Otherwise, residual dopants intended for only source and drain carrier reservoirs 140 and 145 will remain present underneath the gate in the channel region, effectively narrowing, or shortening, the channel.

At 158, the recess RIE process removes doped material from the gate regions (both n and p) creating the recessed gate areas 151. In one embodiment, the depth of the recessed gate areas 151 is within the range of about 10-100 nm, with a target of 60 nm. Alternatively, depending on the materials used, it may be possible to determine an etch chemistry that etches the doped material (both n- and p-type) preferentially, without removing the substrate 114 and the STI 122.

It is noted that the process sequence described above (102, 103; FIGS. 2A-4D) for formation of recessed gate MOSFET transistors is executed in the opposite order from a conventional MOSFET fabrication process. In a conventional MOSFET fabrication process, a gate is formed first, above the surface of the substrate 114, for use as a mask during implantation of the source and drain regions. Whereas, according to the present scheme, the source and drain regions are formed first, and the source and drain profiles can then be used to guide formation of a recessed gate structure. Such a process sequence was first described in U.S. Patent Application Publication 2012/0313144 to Zhang et al., entitled "Recessed Gate Field Effect Transistor," published on Dec. 13, 2012.

FIGS. 6A-6D show and describe the process steps 104 and 105 in further detail. Process steps 104 and 105 can be used to form non-planar epitaxial channels in the recessed gate areas 151, according to one embodiment.

Figure 6A:
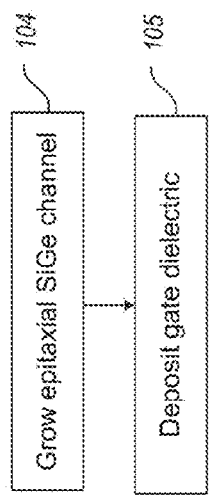
FIG. 6A is a process flow diagram showing a detailed sequence of processing steps that can be used to form epitaxial channels according to one embodiment.
Figure 6B:
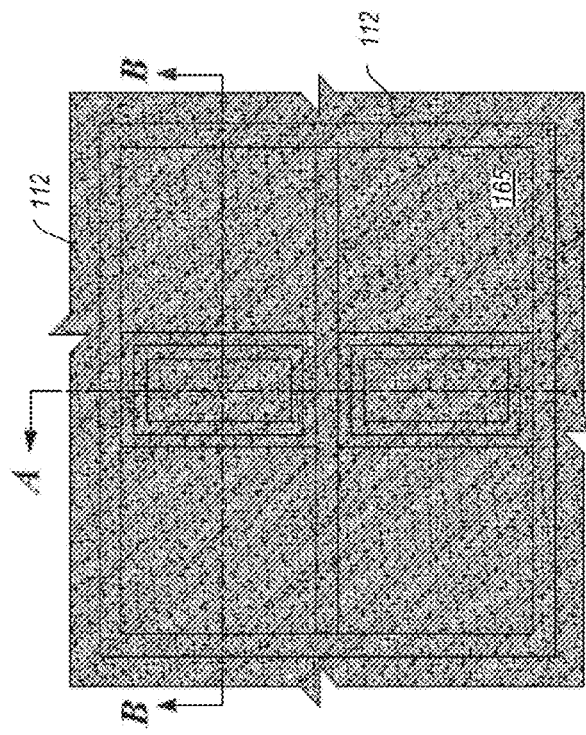
FIG. 6B is a top plan view of a layout for an array of quantum dot PFET and NFET devices after carrying out the processing steps shown in FIG. 6A.
Figure 6C:
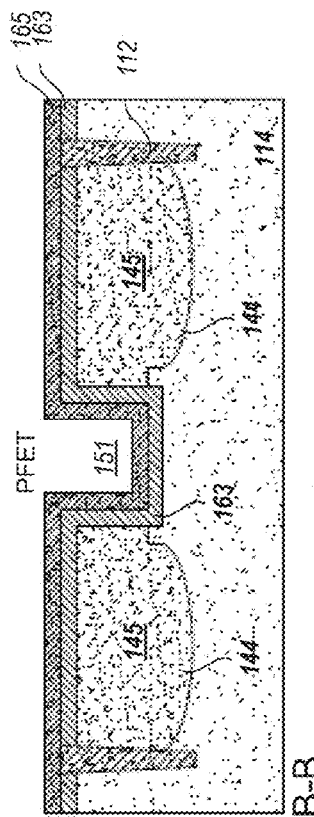
FIG. 6C is a cross-sectional view of the NFET and PFET gates shown in FIG. 6B, taken along the cut lines A-A.
Figure 6D:
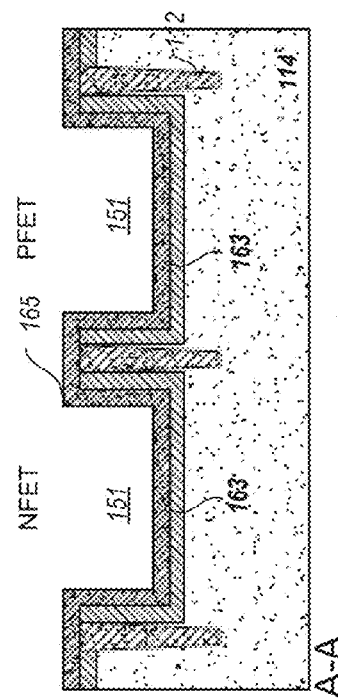
FIG. 6D is a cross-sectional view of the PFET device shown in FIG. 6B, taken along cut lines B-B.

At 104, epitaxial channels 163 are formed by growing an epitaxial layer that covers both the NFET and PFET devices, for example, an epitaxial silicon germanium (SiGe) layer or an epitaxial germanium (Ge) layer. The epitaxial channels 163 are formed below the region where the transistor gates will be formed, lining the recessed gate areas 151, so as to surround the gate on three sides as shown in FIGS. 6C, 6D. The epitaxial channels 163 are desirably about 10-50 nm thick.

At 106, a high-k gate dielectric 165 is formed on top of the epitaxial channel 163, again covering both the NFET and PFET devices. The dielectric constant of the high-k gate dielectric 165 is desirably greater than about 4.0 and the thickness of the high-k gate dielectric 165 is desirably within the range of about 2-20 nm.

FIG. 7A shows the process step 106 in further detail, as a sequence of steps that can be used to form a metal gate electrode, and to form a metal silicide on the doped source and drain carrier reservoirs 145, according to one embodiment.

At 166, quantum dot openings 167 are etched through sections of the high-k gate dielectric 165 and the epitaxial channel 163, and into the doped source and drain carrier reservoirs 145 (FIG. 7D). The quantum dot openings 167 desirably have a diameter, d, within the range of about 10-100 nm (FIG. 7B). The dots are referred to as "quantum dots" because of their small dimensions. In one embodiment, the maximum dimension of the dot will be in the range of 10 nm to 12 nm, while along some directions it may have dimension in the range of less than 5 nm. Thus, the size of the quantum dot is approaching dimensions in the range of 50 Å to 100 Å, in which the atomic effects of the individual atoms and their arrangement in a crystalline structure may have specific effects. The RIE etch depth target can be set, again, using APC, according to a measured step height associated with the recessed gate area 151. The etch depth target is desirably set to a value that results in a depth of the quantum dot openings 167 that is shallower than a corresponding depth 169 of the gate region (FIGS. 7C, 7D).

At 168, a self-aligned metal silicide 171 ("salicide") is formed in the source and drain carrier reservoirs 145. A metal is conformally deposited onto the surface, for example, using a PVD process. The metal comes into contact with the doped silicon in the quantum dot openings and reacts chemically with the doped silicon to form a metal silicide compound. Metal deposited on the recessed gate areas 151 does not form a metal silicide. The metal silicide 171 reduces contact resistance associated with the metal quantum dots, and thus the electrical properties of the metal silicide 171 directly influence device performance. Properties of the metal silicide 171 determine, in large part, a height of a Schottky barrier at the source/drain boundary associated with contact resistance. Properties of the metal silicide 171 are influenced by the type of metal deposited, the type of dopants used, and the doping concentration, and the overall film quality. Dual metal silicides 171 can be formed by depositing the same metal (e.g., titanium or titanium nitride) onto both the n-doped and p-doped regions using two successive masking operations (e.g., using oxide hard masks). Thickness of the metal silicide 171 is desirably in the range of about 1-20 nm, with a film thickness target of 10-20 nm.

At 170, a thin metal gate liner 173, in the range of about 1-10 nm thick, but desirably less than about 8 nm thick, is formed in the recessed gate areas 151 of both of the NFET and PFET devices. In one embodiment, the NFET gate liner includes titanium (Ti) and/or titanium nitride (TiN) or titanium carbide (TiC) for a gate electrode made of tungsten (W). The gate liner 173 can be a multi-layer stack that includes, for example, 1 nm TiN on 5 nm TiC, on 1 nm TiN. In another embodiment, the gate liner 173 includes tantalum (Ta) and/or tantalum nitride (TaN) for a gate electrode made of copper (Cu). The gate liner 173 for PFET devices is desirably made of 1-10 nm TiN targeted at 4 nm. The gate liner 173 for PFET devices can be formed by first depositing the multi-layer stack on both the NFET and PFET devices, masking the NFET devices, etching away the top two layers (e.g., TiN and TiC), and depositing additional TiN.

Figures 8A, 8B, 8C, 8D:
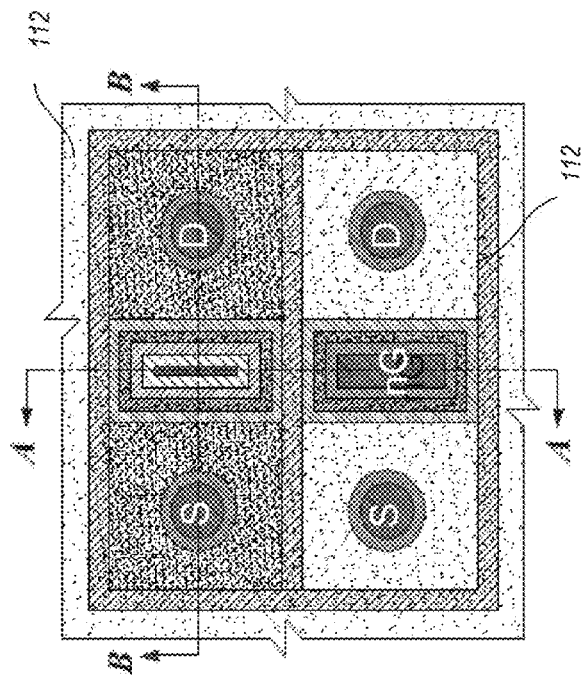
FIG. 8A is a process flow diagram showing a detailed sequence of processing steps that can be used to form metal gate electrodes and metal source and drain quantum dots, according to one embodiment.
FIG. 8B is a top plan view of a layout for an array of quantum dot PFET and NFET devices after completing processing steps shown in FIG. 1, according to a first embodiment.
FIG. 8C is a cross-sectional view of the NFET and PFET gates shown in FIG. 8B, taken along the cut lines A-A.
FIG. 8D is a cross-sectional view of the PFET device shown in FIG. 8B, taken along cut lines B-B.

FIGS. 8A, 8B, and 8C show finished, planarized NFET and PFE devices made according to the second embodiment described above that achieves source and drain doping via in-situ epitaxial growth at step 103. FIG. 8A shows further details of the process step 106, including a processing sequence that can be used to form the metal gate and to embed metal quantum dots into the source and drain regions, according to one embodiment. FIGS. 8B, 8C, and 8D show the finished NFET and PFET devices made according to the first embodiment described, that achieves source and drain doping via ion implantation at step 103.

At 172, bulk metal is deposited in the recessed gate areas 151 to form recessed metal gate electrodes 175 (FIGS. 8C, 8D) and also in the quantum dot openings 167 to form embedded metal quantum dots 177 (FIGS. 8B, 8D) in the source and drain carrier reservoirs 145. Metals suitable for use as metal gate electrodes and metal quantum dots 177 include, for example, tungsten, copper, silver, gold, aluminum, and the like. Thickness of the metal quantum dots 177 is desirably about 60 nm. The metal quantum dots 177 are deposited so as to form a raised source and drain.

The formation of the quantum dot 177 is selected to provide a particular crystalline structure of the metal. As is known, the crystal structure of copper is generally a cube; however, the exact connection of the atoms to each other, as well as the presence of dopants in the material, can modify the crystalline structure and also present different planes of the lattice. The metal, whether copper, aluminum, or the like, which is used will generally have a drastically different crystal structure than the surrounding semiconductor material, and therefore will affect the threshold voltage speed of operation as well as a number of other parameters of the semiconductor. In one preferred embodiment, the quantum dot is composed of tungsten. Another acceptable metal is aluminum. In the event copper or gold are used for the metal in the quantum dot, care will be taken to provide the appropriate liners, such as a tantalum or molybdenum liner for copper, in order to block diffusion of the copper into the silicon lattice and thus harm its operational characteristics. Accordingly, the metal silicide 171 is selected both to affect the device performance and also to provide the appropriate barrier between the type of metal which is placed into the semiconductor substrate to avoid contamination.

The location, as well as the shape and size of the quantum dots, provides significant ability to precisely control the transistor performance. While just a single dot is shown in each of the respective source and drains for a single transistor, in some embodiments two or more dots may be provided, spaced apart from each other. As is also clear in the following description with respect to FIG. 10, it is clear that the quantum dots can have a shape which is also selected to affect transistor performance as discussed in more detail with respect to FIG. 10B.

Another factor which affects device performance is the distance between the gate and the quantum dot. The distance is preferably selected to maintain a sufficient threshold that the transistor does not turn on prematurely due to noise characteristics. Also, the spacing is selected to provide a clear transition from on to off for the transistor. If the quantum dot is too close to the gate, there is some potential for increased interaction between the metal in the quantum dot 177 and the metal charge on the gate electrode during operation. Accordingly, the quantum dot does not physically abut against the gate electrode, but is spaced some small distance away, preferably greater than 5 nm away and less than 100 nm away, so as to provide appropriate spacing and some semiconductor material between the quantum dot and the metal gate.

At 174, the surface of the completed transistor devices is polished using a metal CMP process that stops on the silicon substrate 114 (FIGS. 8C, 8D).

During the metal deposition step, the threshold voltage of the transistor device can be tuned through precise control of the metal film formation at a molecular level. Atomic layer deposition (ALD) is a thin film deposition technique that offers such precise control. For example, various compositions of a silver bromide (AgBr) film can be used to tune the threshold voltage of the MOSFET during the ALD deposition process. If the silver bromide film is rich in bromine atoms, anion quantum dots are deposited, and the AgBr energy gap is altered so as to increase $V_t$. If the silver bromide film is rich in silver atoms, cation quantum dots are deposited, and the AgBr energy gap is altered so as to decrease $V_t$. ALD deposition of neutral quantum dots of different sizes also varies $V_t$.

Figure 10:
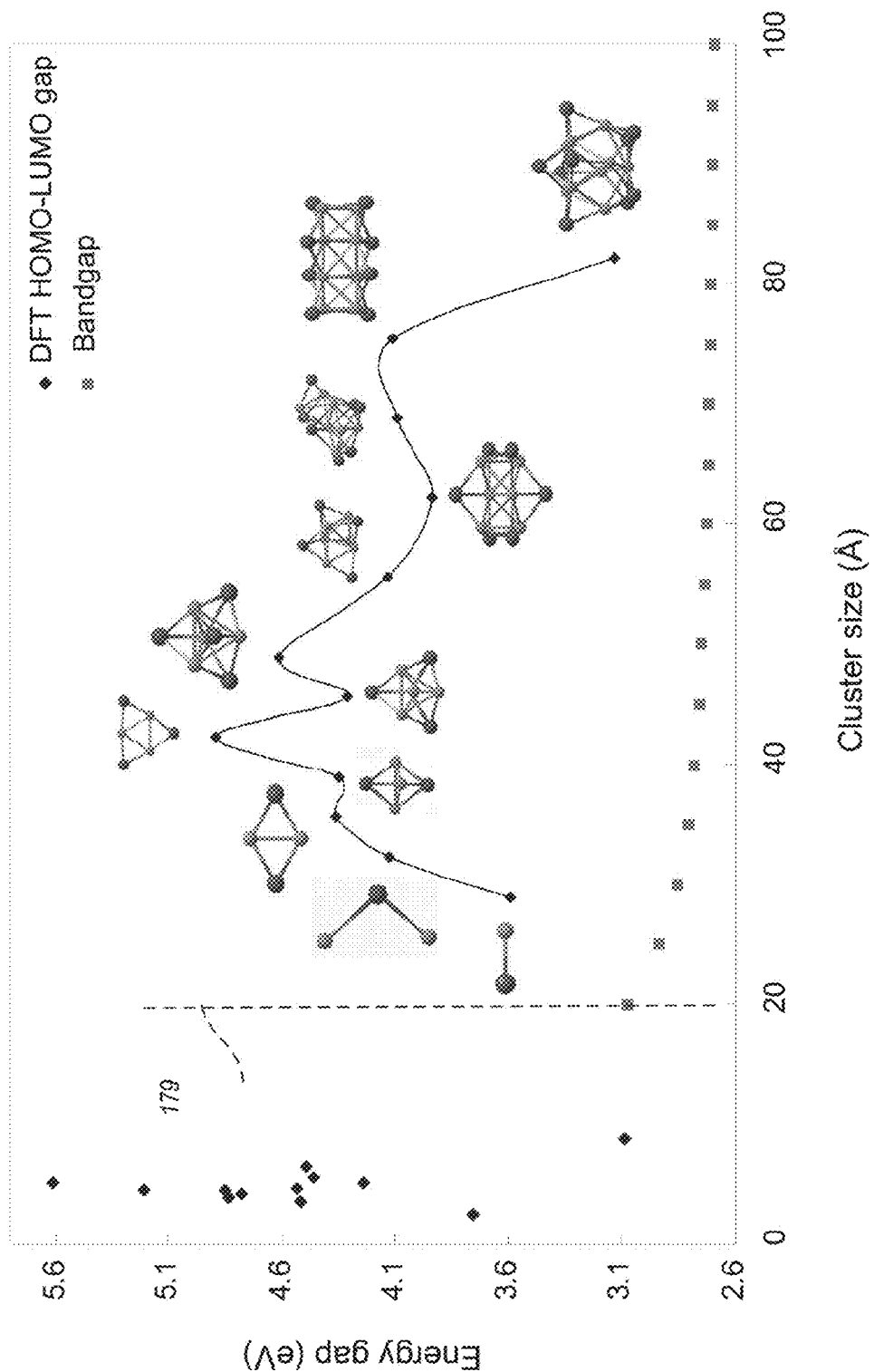
FIG. 10 is a plot of the energy gap of a device containing a neutral silver bromide quantum dot film of various different cluster sizes, according to the prior art.

With reference to FIGS. 9 and 10, tuning of the energy gap occurs because of changes in molecular orbital energy levels upon formation of a molecular cluster from isolated monomers during the film deposition. Formation of neutral clusters from isolated monomers has been studied previously by the present inventor (Zhang et al., *Quantum Size Effect Studies of Isotopic and Electronic Properties of Silver Bromide Ionic Clusters, Nature*, 2012, unpublished). In general, clusters can be formed by attachment of isolated monomers to molecules, or by accumulation of monomers into a molecular cluster as illustrated in FIGS. 9A-9F. A monomer is a basic molecular unit, for example, two bound atoms or three atoms joined in a triangular unit. FIG. 9A shows an example of a two-atom monomer 178a having a large atom 178b (e.g., Br) and a small atom 178c (e.g., Ag). Two such monomers can bind together to form a dimer 178d having four atoms (FIG. 9B). The dimer 178d is bound by three chemical bonds along an axis 178e. Subsequently, another isolated monomer 178a can attach to the dimer 178d to form a trimer 178f that includes six atoms, three Ag and three Br (FIG. 9C); two isolated monomers 178a can attach to the dimer 178d to form a tetramer 178g having eight atoms (FIG. 9D), and so on.

FIG. 10 is a plot of data for neutral silver bromide clusters of various sizes. If a silver bromide metallic film is deposited onto a silicon substrate, the energy gap of the resulting device is altered depending on the cluster size. An amorphous, stable, dense film can be achieved by depositing AgBr in the form of dimers, or trimers, for example, Stabilization comes about because of the structure of the molecular orbitals i.e., which orbitals are occupied and which are unoccupied. The term HOMO refers to highest occupied molecular orbital, and the term LUMO refers to lowest unoccupied molecular orbital. At molecular length scales below about 20 A (179), the energy gap is the difference between the HOMO and the LUMO energies, or the HOMO-LUMO gap. The HOMO-LUMO gap is qualitatively similar to the semiconductor energy band gap that characterizes the crystal at larger length scales (20-100 A on the plot in FIG. 10). This is the reason the data below 20 A in FIG. 10 shows a different trend than the data for cluster sizes above 20 A. The relationship between molecular cluster size and the resulting energy gap of a silicon crystal that has been altered by deposition of silver bromide is such that the band gap tends to decrease for larger clusters. Using a mass spectrometer, the clustering process can theoretically be monitored and controlled to deposit a certain silver bromide cluster size, to achieve a desired energy gap and corresponding threshold voltage.

In the same way that the different molecular compositions and crystalline shape of silver bromide will affect the transistor performance, so will variations in the molecular structure and crystalline formation of other types of metals that can be used. For example, copper may be combined with chloride, bromide, sulfur, or oxygen to create molecular compounds in different lattice structures which will affect the device performance. Accordingly, copper combined with one or more atoms selected from the group of chlorine, bromine, oxygen, or sulfur may be used as the metal for the quantum dot. In particular, a chemical selected from the group 7 atoms (halogens) such as, for example, fluorine, chlorine, or bromine, will have particular effects on the molecular structure with copper, and therefore can be used to provide a desired alteration of the transistor properties. On the other hand, if the element is selected from group 6 of the periodic chart (chalcogens), such as oxygen, sulfur, and the like, then the electrical effect on the transistor performance will be different because of the available valence locations for electron movement.

Two examples have been provided for the particular metal that may be used for the quantum dot in combination with a primary metal. One example is silver combined with bromine, and another is copper combined with one of the elements from either group 7 or group 6, depending on the desired electrical properties. These are just two of the examples that can be used, and other molecular combinations with other metals may also be useful. For example, any one of the metals copper, silver, gold, and the like combined with any one of the elements from groups 6 or 7 may be useful. Similarly, a metal from group 3, such as aluminum, gallium, or indium, may be combined with atoms from either group 1 (hydrogen, lithium, sodium, and the like) or group 7 (fluoride, chlorine, bromine, and the like) in order to achieve desired electrical properties. Aluminum combined with hydrogen atoms provides particular benefits in that it has the ability for easy movement of the electron within the quantum dot lattice structure, and may, in some instances, provide for actual release of the hydrogen atom as well as uptake of the hydrogen atom during semiconductor operation, as the transistor is switched in order to effect the electrical properties in a desired way. Thus, the energy band gap and the charge carrier mobility can be affected based on the presence of hydrogen molecules within the aluminum lattice structure. Also of some importance is the shape of the molecules formed from copper, aluminum, gold, and the like. For example, the molecule may have a face-centered cubic structure, an hexagonal close-packed structure, or the like. While specific examples have been given for silver bromide, it is expected that similar corresponding examples could also be provided by the other metals which may be used as the quantum dot materials herein.

Figure 11A:
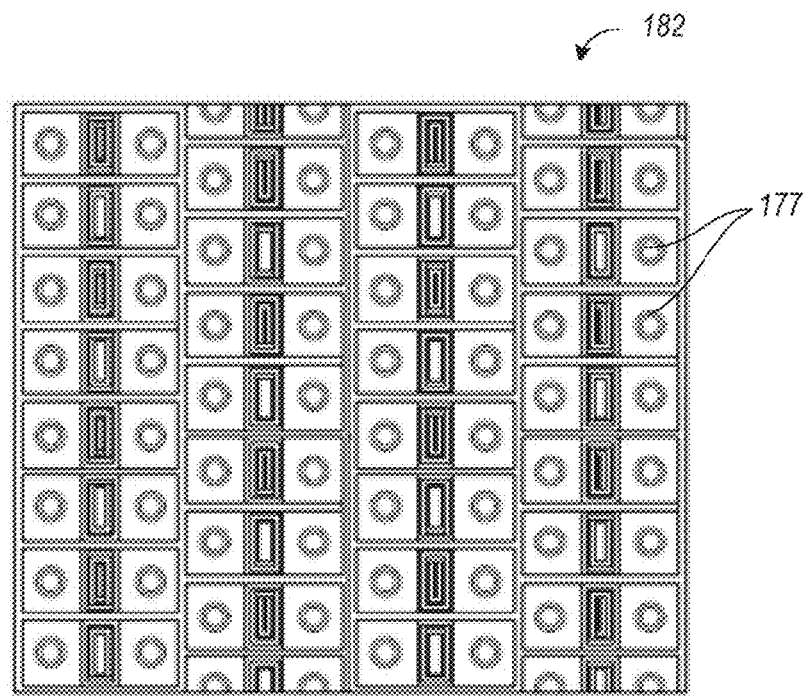
FIG. 11A is a top plan view of a layout of a densely-packed offset array of MOSFETs containing quantum dot sources and drains.
Figure 11B:
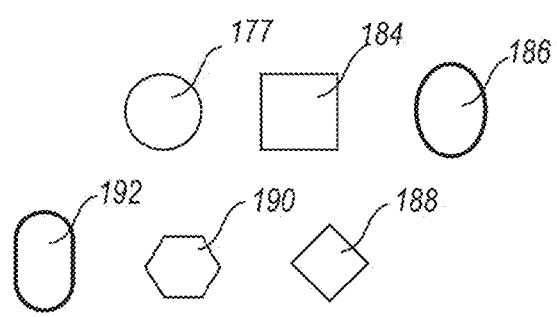
FIG. 11B shows alternative shapes of quantum dots for use in integrated circuit layouts.

FIGS. 11A and 11B show top plan views of alternative quantum dot array designs. One alternative to a square array layout shown above in each of the preceding plan views is an offset array 182 of quantum dot devices shown in FIG. 10A. The offset array 182 packs the quantum dot devices into a higher density matrix. FIG. 11B shows alternative geometries for the circular quantum dots 177 patterned in FIG. 11A, including polygons such as square quantum dots 184, diamond quantum dots 188, and hexagonal quantum dots, 190. Alternatively, elongated quantum dots can be used such as elliptical quantum dots 186 and oblong quantum dots 192. Such alternative quantum dot shapes may be advantageous with respect to design, layout, processing, or performance of MOSFET devices that incorporate quantum dots.

In a preferred embodiment, the quantum dots are in the shape of a column 192, also referred to as the oblong quantum dot 192. The use of a column quantum dot 192 has a number of particular advantages with respect to transistor operation. The length of the column 192 will be selected to be approximately equal to the channel width. (As is known in semiconductor terminology, the channel length is the distance between the source and the drain, and the channel width is perpendicular to this, the sideways extension of the channel.) By having a column shape 192 for the quantum dot, the effect of the quantum dot will be uniform across the entire channel, and therefore the electrical conduction properties that are affected by the quantum dot will be substantially uniform across the entire channel dimensions. Accordingly, when a column shape 192 is selected for the quantum dot, the quantum dot will be relatively thin, for example less than about 10 nm, and the length of the quantum dot will be approximately equal to the channel width. A diamond shape 188 or square shape 184 for the quantum dot also has a particular effect on the electrical characteristics. As will be appreciated, electrical charge often accumulates at point locations. The use of a diamond shape 188 will affect electrical charge buildup at the points of the diamond, which will have an effect on the conduction locations through the channel. Similarly, a hexagon or octagon shape 190 provides additional points, and the orientation of the hexagon or octagon 190 with respect to the channel can be selected to produce the desired electrical properties.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of making a transistor, the method comprising:
   forming two isolation trenches in a substrate;
   forming source and drain regions by doping portions of the substrate between the two isolation trenches;
   forming a first recessed area between the source and drain regions by removing doped portions of the substrate;
   forming a second recessed area in the source region by removing doped portions of the substrate;
   forming a channel in the first recessed area of the substrate;
   forming a metal gate in the first recessed area of the substrate;
   forming a silicide layer on bottom and side walls of the second recessed area;
   selecting a threshold voltage for the transistor; and
   embedding a first metal quantum dot into the silicide layer in the source region, the first metal quantum dot having a selected molecular composition that sets a threshold voltage of the transistor to the selected threshold voltage.

2. The method of claim 1, further comprising:
   forming a third recessed area in the drain region by removing doped portions of the substrate;
   forming the silicide layer on bottom and side walls of the third recessed area; and
   embedding a second metal quantum dot into the silicide layer in the drain region, the second metal quantum dot having a selected composition that, together with the selected molecular composition of the first metal quantum dot in the source region, sets the threshold voltage of the transistor to the selected threshold voltage.

3. The method of claim 1 wherein embedding the first metal quantum dot uses an atomic layer deposition technique.

4. The method of claim 1 wherein the metal gate includes a top surface and a bottom surface opposite the top surface, the bottom surface being closer to the channel than the top surface, the top surface of the metal gate being coplanar with a top surface of the substrate.

5. The method of claim 1 wherein doping portions of the substrate includes implanting ions into the substrate.

6. The method of claim 1 wherein the doping includes incorporating dopants in-situ while depositing an epitaxial layer onto the substrate.

7. The method of claim 1 wherein the embedding further comprises varying the composition of the first metal quantum dot using a mass spectrometer.

8. The method of claim 1 wherein removing the doped portions entails use of an etching process targeted according to a measured doping profile.

9. A method, comprising:
   selecting a first threshold voltage;
   forming a plurality of n-type field effect transistors in a silicon substrate, the n-type transistors having n-doped source and drain regions that each contain embedded silver bromide quantum dots;
   forming a silicide layer lining between each of the embedded silver bromide quantum dots and the respective n-doped source and drain regions on bottom and side walls of the embedded silver bromide quantum dots, the embedded silver bromide quantum dots in the n-type field effect transistors having a molecular composition that causes the plurality of n-type field effect transistors to each have a threshold voltage matched with the selected first threshold voltage;

selecting a second threshold voltage;

forming a plurality of p-type field effect transistors in the silicon substrate, the p-type transistors having p-doped source and drain regions that contain embedded silver bromide quantum dots; and forming a silicide layer lining between each of the embedded silver bromide quantum dots and the respective p-doped source and drain regions on bottom and side walls of the embedded silver bromide quantum dots, the embedded silver bromide quantum dots in the p-type field effect transistors having a molecular composition that causes the plurality of p-type field effect transistors to have a threshold voltage matched with the selected second threshold voltage.

10. The method of claim 9 wherein the embedded silver bromide quantum dots include neutral clusters of monomers.

11. The method of claim 10 wherein a selected size of the neutral clusters of monomers corresponds to the first and second threshold voltages.

12. The method of claim 9 wherein forming the transistor further includes forming a metal gate having a work function material that includes titanium.

13. A method, comprising:

forming in a silicon substrate a transistor having a doped source with a first recess, a doped drain with a second recess, a channel, and a recessed metal gate;

forming a silicide layer on bottom and side walls of the first recess and the second recess;

selecting a threshold voltage for the transistor; and forming a first metal quantum dot in the silicide layer at the doped source and a second metal quantum dot in the silicide layer at the doped drain, each of the metal quantum dots having a selected molecular composition of a cluster of monomers that tunes the threshold voltage of the transistor to the selected threshold voltage.

14. The method of claim 13 wherein the selected molecular composition includes silver bromide (AgBr) clusters.

15. The method of claim 14 wherein the silver bromide clusters are rich in silver and the threshold voltage of the transistor is lowered as the metal quantum dots are formed.

16. The method of claim 14 wherein the silver bromide clusters are rich in bromine and the threshold voltage is raised as the metal quantum dots are formed.

17. The method of claim 14 wherein one or more of the doped source, doped drain, and channel are epitaxially grown.

18. The method of claim 17 wherein the source and drain are doped in-situ during the epitaxial growth.

19. The method of claim 13 wherein the source and drain are doped using an ion implantation process.

20. The method of claim 13, further comprising forming a raised source and a raised drain.

* * * * *